US010221027B2

(12) United States Patent
Takanami et al.

(10) Patent No.: US 10,221,027 B2
(45) Date of Patent: Mar. 5, 2019

(54) TAPE FEEDER (71) Applicant: Panasonic Intellectual Property Management Co., Ltd., Osaka (JP)

(72) Inventors: Yasuo Takanami, Yamanashi (JP); Chikara Takata, Yamanashi (JP); Yasuo Oku, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 151 days.

(21) Appl. No.: 15/373,749

(22) Filed: Dec. 9, 2016

(65) Prior Publication Data

US 2017/0225919 A1    Aug. 10, 2017

(30) Foreign Application Priority Data

Feb. 4, 2016    (JP) .................................. 2016-019871

(51) Int. Cl.
*B65H 20/20* (2006.01)
*H05K 13/04* (2006.01)
*B65H 37/00* (2006.01)

(52) U.S. Cl.
CPC ........... *B65H 20/20* (2013.01); *B65H 37/002* (2013.01); *H05K 13/0417* (2013.01); *H05K 13/0419* (2018.08); *B65H 2301/4493* (2013.01); *B65H 2301/51122* (2013.01); *B65H 2406/34* (2013.01); *B65H 2408/214* (2013.01); *B65H 2701/1942* (2013.01)

(58) Field of Classification Search
CPC .... B65H 20/20; B65H 20/22; B65H 2403/47; B65H 2403/725; B65H 2403/7251
See application file for complete search history.

(56) References Cited

U.S. PATENT DOCUMENTS

| 4,610,083 A * | 9/1986 | Campisi ............. H05K 13/0417 156/751 |
| 6,162,007 A * | 12/2000 | Witte ..................... B65H 20/22 221/211 |
| 6,179,190 B1 * | 1/2001 | Kim ..................... B65H 37/002 226/115 |
| 6,250,578 B1 * | 6/2001 | Manda ............... B65H 75/4431 191/12.2 R |
| 2003/0072644 A1 | 4/2003 | Yamamura et al. |
| 2005/0160593 A1 | 7/2005 | Yamamura et al. |

FOREIGN PATENT DOCUMENTS

JP    3885547 B2    2/2007

* cited by examiner

*Primary Examiner* — Michael C McCullough
(74) *Attorney, Agent, or Firm* — Pearne & Gordon LLP (57) ABSTRACT According to the present disclosure, a tape feeder includes a main body that is attached to a component mounter and has a tape traveling path which is a traveling path of a carrier tape; and a sprocket that is provided in the main body, causes an outer peripheral tooth to engage with a feed hole of the carrier tape, and rotates so as to perform pitch feeding of the carrier tape on the tape traveling path. The tape feeder includes a lock mechanism that has a press operation unit operated with pressing force, locks the sprocket in the main body in a state where the press operation unit is not operated, and unlocks the sprocket in a state where the press operation unit is operated.

9 Claims, 12 Drawing Sheets

TAPE FEEDER

BACKGROUND

1. Technical Field

The present disclosure relates to a tape feeder which causes a carrier tape holding a component to travel on a tape traveling path so as to supply the component to a pick-up position of a component mounter.

2. Description of the Related Art

In the related art, tape feeders become known as a representative type of component supplier in a component mounter. The component mounter is a device which installs a component in a board by sucking the component with a suction nozzle, and the tape feeder supplies the component to a pick-up position of the component mounter by performing pitch feeding of a carrier tape holding the component. The tape feeder includes a main body that is attached to the component mounter and has a tape traveling path which is a traveling path of the carrier tape; and a sprocket that is attached to the main body, causes an outer peripheral tooth to engage with a feed hole of the carrier tape, and rotates so as to perform pitch feeding of the carrier tape on the tape traveling path. The sprocket is driven by a motor, and a feeding amount of the carrier tape is controlled based on an amount of rotation of the sprocket. Therefore, in order to accurately supply a component to the pick-up position, there is a need to adjust the matching state between a rotation stop position of the sprocket and data of an amount of rotation of the motor, in advance (for example, refer to Japanese Patent No. 3885547).

SUMMARY

According to the present disclosure, a tape feeder performs pitch feeding of a carrier tape holding a component so as to supply the component to a pick-up position for a suction nozzle included in a component mounter. According to the present disclosure, the tape feeder includes a main body that has a tape traveling path which is a traveling path of the carrier tape; a sprocket that is provided in the main body, causes an outer peripheral tooth to engage with a feed hole of the carrier tape, and rotates so as to perform pitch feeding of the carrier tape on the tape traveling path; and a lock mechanism that has a press operation unit operated with pressing force, locks the sprocket in the main body in a state where the press operation unit is not operated, and unlocks the sprocket in a state where the press operation unit is operated.

DETAILED DESCRIPTION

Before describing an exemplary embodiment of the present disclosure, a problem of tape feeders in the related art will be simply described.

In the tape feeders in the related art, in a state where power is not supplied to a motor, for example, when not in use, a sprocket is in a freely rotatable state. Therefore, when power is stopped being supplied to the tape feeder, for example, when work is finished, a rotation stop position of the sprocket is deviated from that at the time work is finished. Therefore, when power starts to be supplied again, the rotation stop position of the sprocket needs to be adjusted again, thereby resulting in a problem of deterioration of work efficiency to that extent.

Exemplary Embodiment

Figure 1:
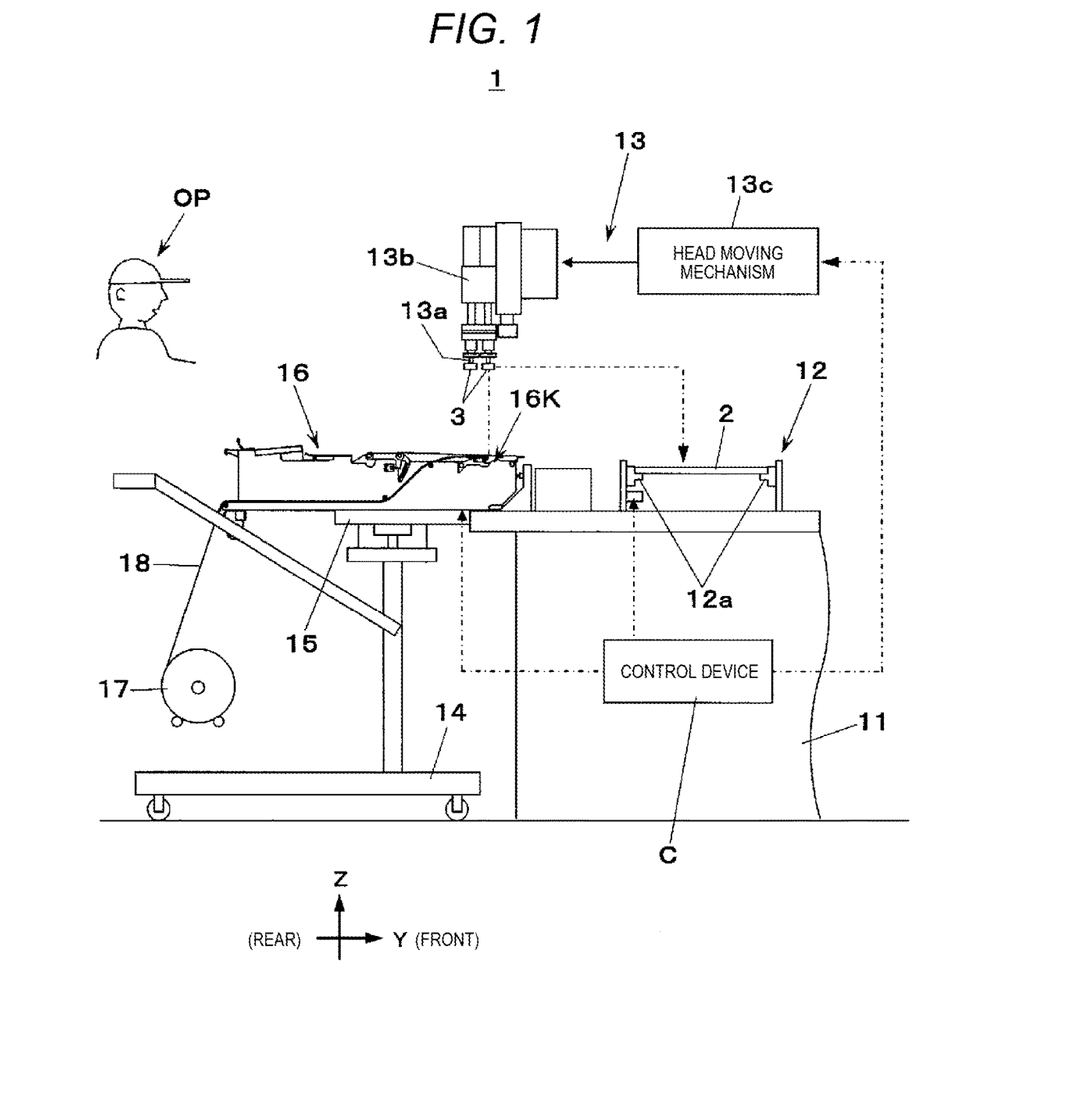
FIG. 1 is a side view of a component mounter having a tape feeder of an exemplary embodiment of the present disclosure.
Figure 2:
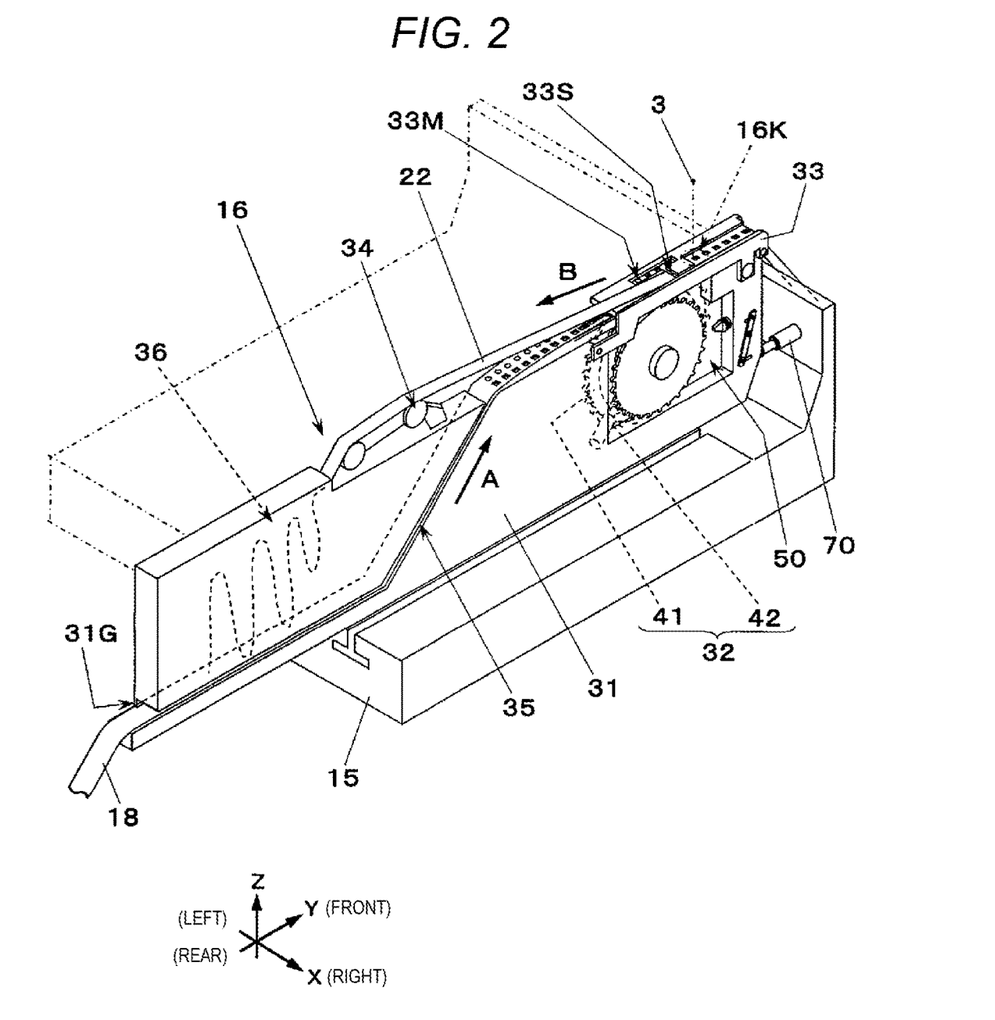
FIG. 2 is a perspective view of the tape feeder of the exemplary embodiment of the present disclosure.

Hereinafter, the exemplary embodiment of the present disclosure will be described with reference to the drawings. Component mounter 1 illustrated in FIG. 1 is a device which mounts component 3 in board 2. Component mounter 1 has board transporter 12 and component installer 13 on base 11. Feeder base 15 moved by carriage 14 is connected to base 11, and tape feeder 16 is attached to feeder base 15 (FIG. 2).

In FIG. 1, board transporter 12 is formed to have pair of conveyers 12a disposed in a Y-axis direction (forward-rearward direction when viewed from worker OP), and board transporter 12 transports board 2 in an X-axis direction (transverse direction when viewed from worker OP). Component installer 13 is configured to include installation head 13b having suction nozzle 13a, and head moving mechanism 13c moving installation head 13b in the in-horizontal plane direction. Installation head 13b can move suction nozzle 13a in a Z-axis direction (vertical direction), and installation head 13b can rotate suction nozzle 13a around a Z-axis.

Multiple tape feeders 16 are attached to feeder base 15 so as to be arranged in the X-axis direction. As illustrated in FIG. 1, carrier tape 18 drawn out from reel 17 held in carriage 14 is introduced to each tape feeder 16 (also refer to FIG. 2). Carrier tape 18 holds component 3, and each tape feeder 16 performs pitch feeding of carrier tape 18, thereby intermittently supplying component 3 held by carrier tape 18 to pick-up position 16K of component 3 for suction nozzle 13a.

Figure 3:
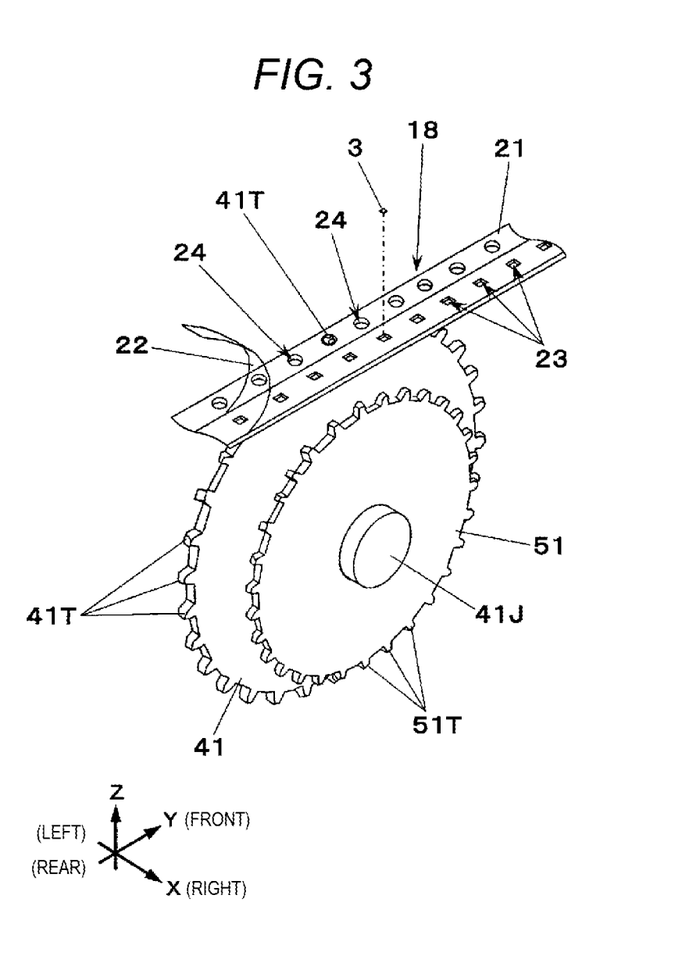
FIG. 3 is a perspective view of a carrier tape which travels in response to the tape feeder of the exemplary embodiment of the present disclosure and is illustrated together with a portion of the tape feeder.

As illustrated in FIG. 3, carrier tape 18 has a configuration in which transparent cover tape 22 is pasted on the top surface of base tape 21. Multiple component storages 23 are provided in base tape 21 so as to be arranged in line, and component 3 is stored in each component storage 23. Cover tape 22 covers each component storage 23 from above so as to prevent component 3 from falling off from component storage 23. Feed holes 24 are provided at a position parallel to the line of component storages 23 in base tape 21 so as to be arranged in line.

Figure 4:
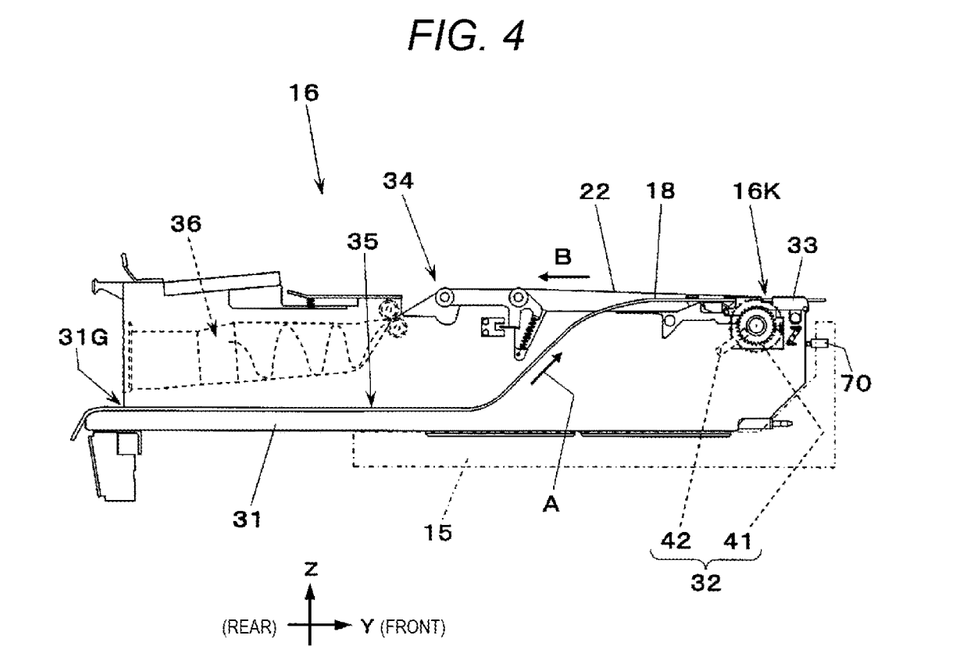
FIG. 4 is a side view of the tape feeder of the exemplary embodiment of the present disclosure.

As illustrated in FIGS. 2 and 4, in tape feeder 16, tape traveling mechanism 32, tape pressing member 33, and cover tape collecting mechanism 34 are included in main body 31 which is attachably/detachably installed in feeder base 15. Tape traveling path 35 which is a traveling path of carrier tape 18 is provided in main body 31. In the present exemplary embodiment, tape traveling path 35 extends horizontally to the front from tape introduction port 31G (FIGS. 2 and 4) formed in a rear end lower part of main body 31. Thereafter, tape traveling path 35 extends obliquely upward to the front at an intermediate part of main body 31, and tape traveling path 35 extends forward from main body 31 in a state of being exposed on the top surface of main body 31.

In FIGS. 2 and 4, tape traveling mechanism 32 has sprocket 41 which is provided at a position upward to the front from main body 31, and drive motor 42 which intermittently drives sprocket 41 to rotate around an X-axis. Sprocket 41 rotates while causing outer peripheral teeth 41T (FIG. 3) to respectively engage with feed holes 24 of carrier tape 18, thereby performing pitch feeding of carrier tape 18 on tape traveling path 35 (arrow A indicated in FIGS. 2 and 4). Accordingly, carrier tape 18 intermittently causes component storages 23 (that is, components 3) to be positioned at pick-up position 16K.

Figure 5:
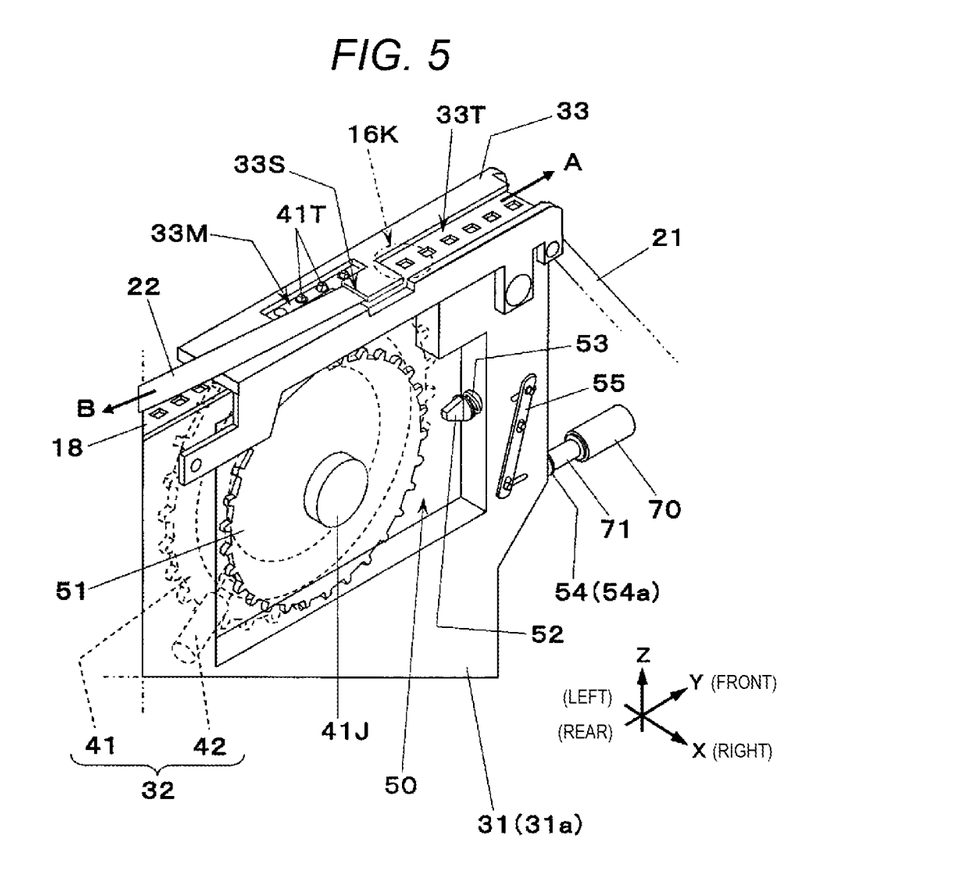
FIG. 5 is a perspective view of the portion of the tape feeder of the exemplary embodiment of the present disclosure.

In FIGS. 2 and 4, tape pressing member 33 is provided so as to extend in a manner parallel to tape traveling path 35 positioned immediately below at a position upward to the front from main body 31. Tape pressing member 33 covers a part in which outer peripheral teeth 41T of sprocket 41 engage (a region in the vicinity of pick-up position 16K) in carrier tape 18 traveling tape traveling path 35, and tape pressing member 33 preses carrier tape 18 of the part from above. As illustrated in FIG. 5, tape pressing member 33 is provided with component supply opening 33T which is provided so as to open the top of component storage 23 positioned at pick-up position 16K, slit 33S for drawing out peeled-off cover tape 22, and groove 33M for avoiding interference with outer peripheral teeth 41T of sprocket 41. Slit 33S is positioned at the rear of component supply opening 33T.

After a portion of cover tape 22 on the lead side is peeled off in advance from base tape 21 by worker OP, cover tape 22 is drawn out upward to the rear through slit 33S (FIGS. 2, 4, and 5), and cover tape 22 is introduced to cover tape collecting mechanism 34 provided at a position above an intermediate part of main body 31. Cover tape collecting mechanism 34 intermittently pulls cover tape 22 in response to tape traveling mechanism 32 performing pitch feeding of carrier tape 18 (arrow B indicated in FIGS. 2, 4, and 5), and cover tape collecting mechanism 34 contains pulled cover tape 22 inside cover tape container 36 which is formed at the rear inside main body 31. Therefore, cover tape 22 is peeled off from base tape 21 while having slit 33S as a peeling-off position. At the point of time when component storage 23 arrives at pick-up position 16K, component storage 23 is in an exposed state, not covered with cover tape 22. Accordingly, installation head 13b can pick up component 3 positioned at pick-up position 16K by sucking component 3 with suction nozzle 13a.

In component mounter 1 having the above-described configuration, control device C (FIG. 1) included in component mounter 1 performs operational control of board transporter 12, component installer 13, tape feeder 16, and the like. Board transporter 12 controlled by control device C firstly carries in board 2 sent from the upstream process side such that board 2 is positioned at a work position. Tape feeder 16 is operated so as to supply component 3 to pick-up position 16K, and head moving mechanism 13c causes installation head 13b to reciprocate between tape feeder 16 and board 2. Installation head 13b uses suction nozzle 13a to pick up component 3 positioned at pick-up position 16K by tape feeder 16, through component supply opening 33T, and installation head 13b installs picked-up component 3 in board 2. When all components 3 to be installed in board 2 are installed in board 2 by installation head 13b, board transporter 12 carries out board 2 to the downstream process side.

Tape feeder 16 applied to component mounter 1 having such a configuration is provided with lock mechanism 50 which can regulate free rotation of sprocket 41 when not in use (FIGS. 2, 5, 6A, and 6B), and description thereof will be given below.

Figure 6A:
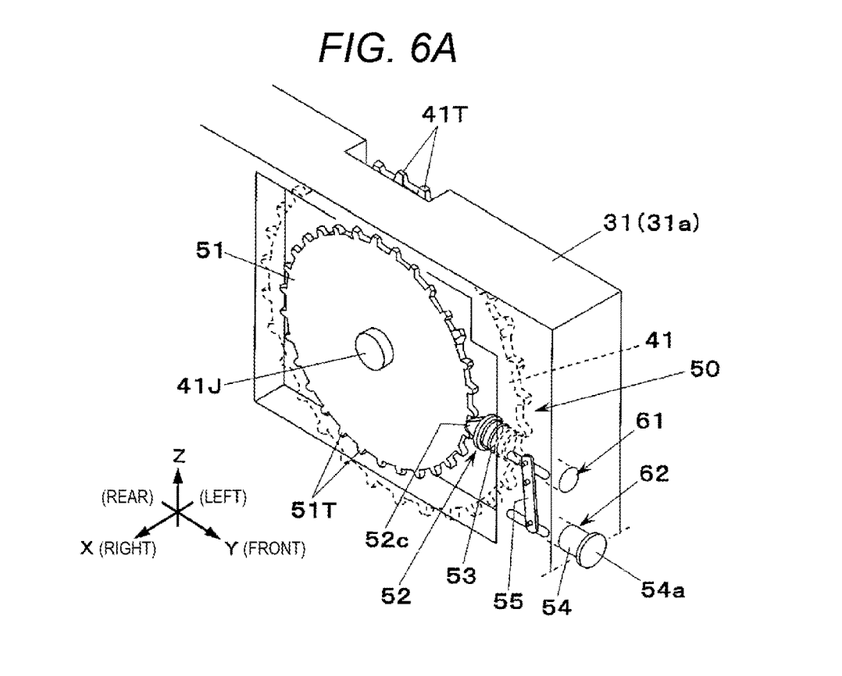
FIG. 6A is a perspective view of a lock mechanism included in the tape feeder of the exemplary embodiment of the present disclosure.
Figure 6B:
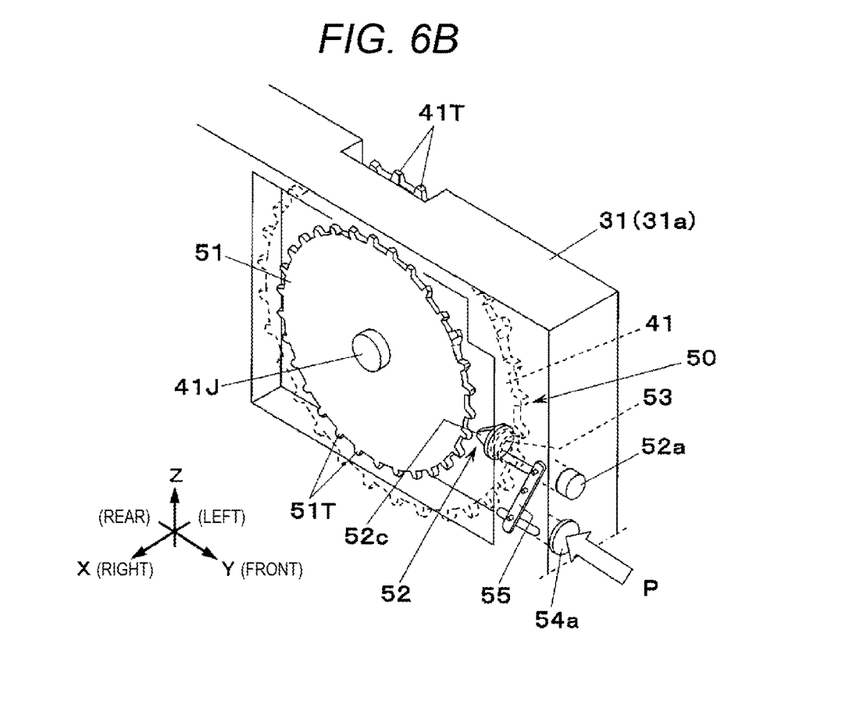
FIG. 6B is a perspective view of the lock mechanism included in the tape feeder of the exemplary embodiment of the present disclosure.

In FIGS. 5, 6A, and 6B, lock mechanism 50 includes rotation member 51, regulation member 52, biasing spring 53, release operation member 54, and connection member 55. Rotation member 51 is provided on a side surface, on a side opposite to the side provided with sprocket 41, between the right and left side surfaces of main body 31 of tape feeder 16. Rotation member 51 has outer peripheral teeth 51T of which the number of teeth corresponds to the pitch of component storage 23 included in carrier tape 18 (in a case where tape feeder 16 can perform pitch feeding of multiple types of carrier tapes 18 of which the pitches of component storages 23 are different from each other, the pitch of component storage 23 included in carrier tape 18 of which the pitch of component storage 23 is minimized), and rotation member 51 rotates integrally with sprocket 41 attached to rotary axis 41J of sprocket 41 (also refer to FIG. 3).

In FIGS. 6A, 6B, 7A, 7B, 8A, and 8B, in lock mechanism attacher 31a in front of rotation member 51 in main body 31, two cylinders (upper cylinder 61 and lower cylinder 62) formed so as to extend in the forward-rearward direction are provided so as to be arranged vertically in parallel. In regulation member 52, cylindrical slider 52a is inserted through upper cylinder 61 from the rear side. Regulation member 52 has flange 52b at the end of slider 52a on the rear side, and the rear surface of flange 52b is provided with projection 52c extending so as to protrude rearward. Flange 52b has an outer diameter greater than the inner diameter of upper cylinder 61, and flange 52b is positioned at the rear of upper cylinder 61. Regulation member 52 is a member regulating rotation of sprocket 41 by causing projection 52c to come into contact with rotation member 51 (specifically, to fit between two outer peripheral teeth 51T adjacent to each other).

Figure 7A:
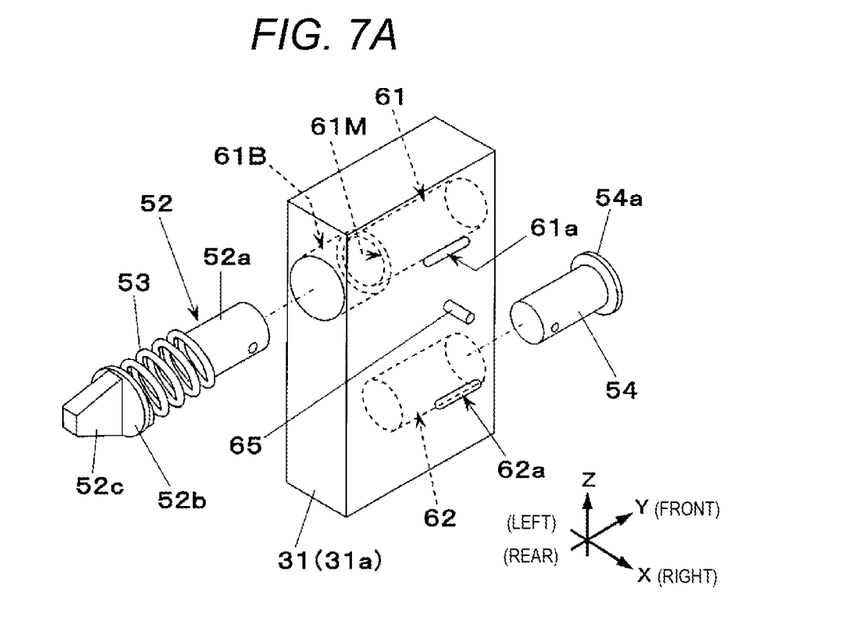
FIG. 7A is an exploded perspective view of the lock mechanism included in the tape feeder of the exemplary embodiment of the present disclosure.
Figure 7B:
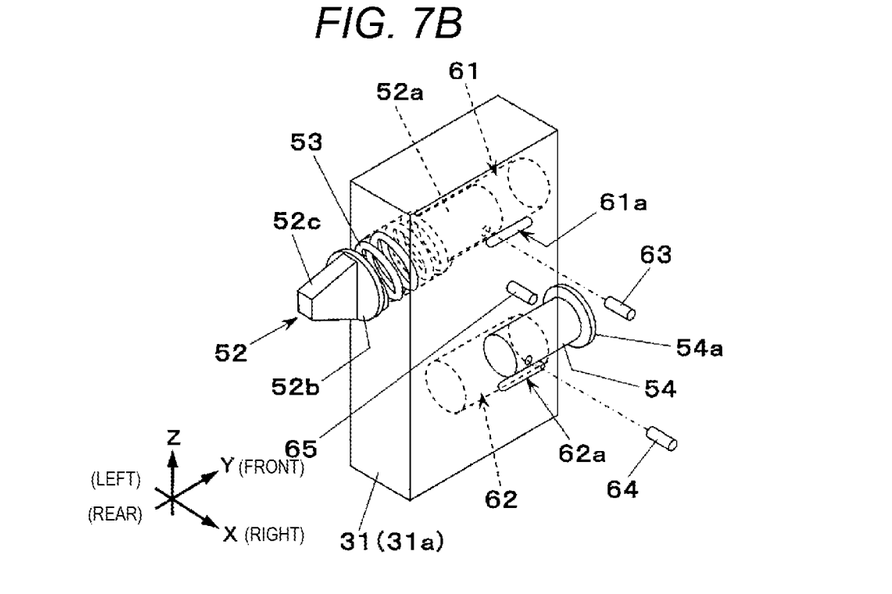
FIG. 7B is an exploded perspective view of the lock mechanism included in the tape feeder of the exemplary embodiment of the present disclosure.

In FIG. 7A, spring container 61B having an inner diameter greater than that of upper cylinder 61 is formed on the rear end side of upper cylinder 61, and biasing spring 53 is contained in spring container 61B from the rear. Slider 52a of regulation member 52 is inserted through biasing spring 53 from the rear side, and the front end surface of biasing spring 53 is in contact with perpendicular surface 61M (FIG. 7A) from the rear at a boundary between upper cylinder 61 and spring container 61B. Meanwhile, the rear end of biasing spring 53 is in contact with flange 52b of regulation member 52 from the front. Biasing spring 53 is a biasing member which biases regulation member 52 in the contact direction toward rotation member 51 (here, rearward). Here, biasing spring 53 biases an intermediate part of regulation member 52 (flange 52b) in the contact direction toward rotation member 51 (rearward).

In FIGS. 7A, 7B, 8A, and 8B, release operation member 54 is formed of a cylindrical member and is inserted through lower cylinder 62 from the front side. The front end of release operation member 54 protrudes forward through an opening of lower cylinder 62 on the front end side. The front end thereof is provided with disk-shaped press operation unit 54a having an outer shape greater than the inner diameter of lower cylinder 62.

Lock mechanism attacher 31a is provided with upper long hole 61a which communicates with upper cylinder 61 and is open on the side surface of lock mechanism attacher 31a so as to extend in the forward-rearward direction.

In addition, lock mechanism attacher 31a is provided with lower long hole 62a which communicates with lower cylinder 62 and is open on the side surface of lock mechanism attacher 31a so as to extend in the forward-rearward direction.

Slider 52a of regulation member 52 is provided with upper pin 63 extending in the X-axis direction. Upper pin 63 extends so as to penetrate upper long hole 61a. When regulation member 52 moves inside upper cylinder 61 in the forward-rearward direction, upper pin 63 moves inside upper long hole 61a in the forward-rearward direction. Release operation member 54 is provided with lower pin 64 extending in the X-axis direction. Lower pin 64 extends so as to penetrate lower long hole 62a. When release operation member 54 moves inside lower cylinder 62 in the forward-rearward direction, lower pin 64 moves inside lower long hole 62a in the forward-rearward direction. Center pin 65 extending in the X-axis direction is provided on the side surface of lock mechanism attacher 31a, that is, at an intermediate position between the upper long hole 61a and lower long hole 62a.

Figure 8A:
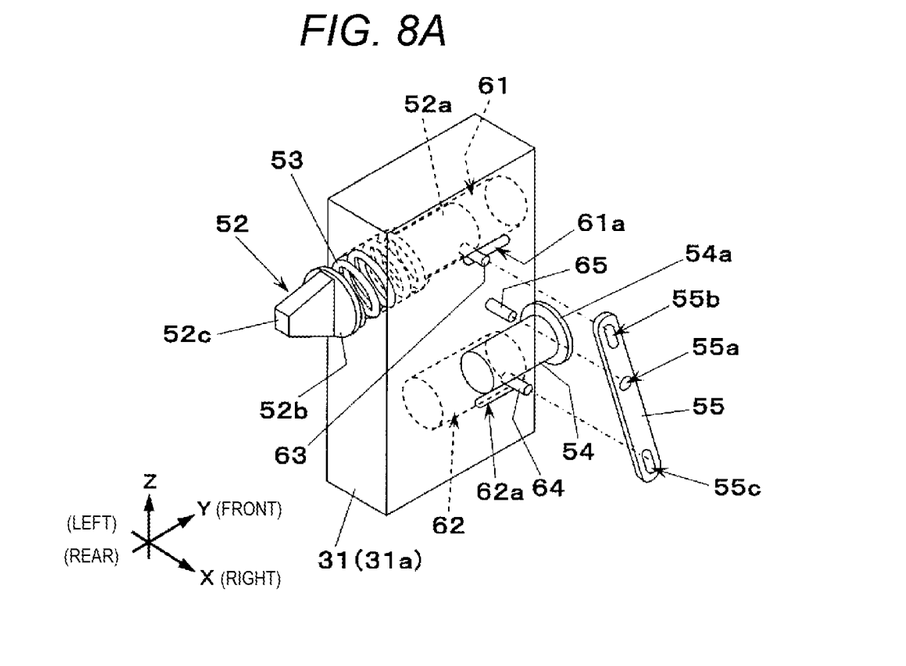
FIG. 8A is an exploded perspective view of the lock mechanism included in the tape feeder of the exemplary embodiment of the present disclosure.
Figure 8B:
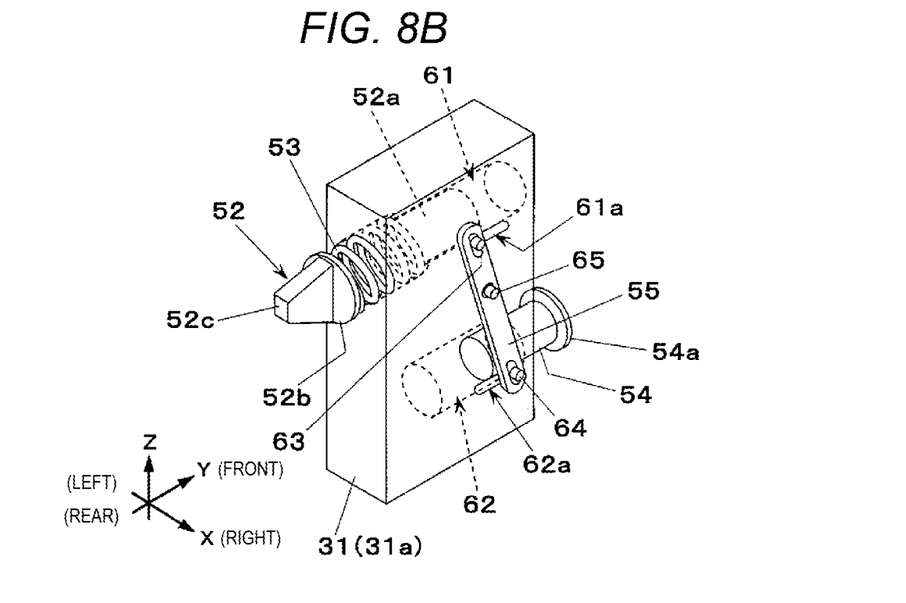
FIG. 8B is an exploded perspective view of the lock mechanism included in the tape feeder of the exemplary embodiment of the present disclosure.

In FIGS. 8A and 8B, in connection member 55, center pin 65 is inserted through pivotal support hole 55a provided at an intermediate part, and connection member 55 swings freely around center pin 65 (that is, around the X-axis). Upper long hole 55b extending in the longitudinal direction of connection member 55 is provided in an upper part of connection member 55, and lower long hole 55c extending in the longitudinal direction of connection member 55 is provided in a lower part of connection member 55. Upper pin 63 is inserted through upper long hole 55b of connection member 55, and lower pin 64 is inserted through lower long hole 55c of connection member 55. Therefore, when release operation member 54 moves in the forward-rearward direction, lower pin 64 causes connection member 55 to swing around center pin 65 via lower long hole 62a, and connection member 55 moves upper pin 63 in the forward-rearward direction via upper long hole 61a. Accordingly, regulation member 52 moves in the forward-rearward direction. In this manner, connection member 55 is a member connecting release operation member 54 and regulation member 52. Here, the moving direction of release operation member 54 and the moving direction of regulation member 52 are directions opposite to each other.

In lock mechanism 50 having such a configuration, in a state where no pressing force acts on press operation unit 54a, regulation member 52 is positioned at "lock position" where projection 52c fits (that is, comes into contact with rotation member 51) between two outer peripheral teeth 51T adjacent to each other in rotation member 51, due to the rearward biasing force of biasing spring 53 (FIG. 6A). In addition, in a state where regulation member 52 is positioned at the lock position, press operation unit 54a is positioned at a position (will be referred to as "initial position") protruding forward through the opening of lower cylinder 62 on the front end side. In a state where regulation member 52 is positioned at the lock position and press operation unit 54a is positioned at the initial position, rotation of rotation member 51 is regulated, and sprocket 41 is in a state of being locked in main body 31.

When press operation unit 54a is pressed rearward in a state where sprocket 41 is locked (arrow P indicated in FIG. 6B), release operation member 54 moves inside lower cylinder 62 in the rearward direction. Accordingly, lower pin 64 moves rearward inside lower long hole 62a, and lower pin 64 causes connection member 55 to swing around center pin 65 via lower long hole 55c. Therefore, regulation member 52 moves forward (that is, a direction opposite to the direction in which release operation member 54 moves when subjected to a press operation) against the biasing force of biasing spring 53, and projection 52c is positioned at "unlock position" so as to be separated from rotation member 51 (FIG. 6B). In a state where regulation member 52 is positioned at the unlock position, rotation member 51 can rotate freely, and sprocket 41 is in an unlocked state. In this manner, in the present exemplary embodiment, when press operation unit 54a is operated, release operation member 54 and connection member 55 serve as lock releasers which separate regulation member 52 from rotation member 51 against the biasing force of biasing spring 53.

In a state where sprocket 41 is unlocked, when pressing force of press operation unit 54a is eliminated, regulation member 52 moves rearward due to the biasing force of biasing spring 53 and returns to the lock position. In this case, upper pin 63 moves rearward inside upper long hole 61a, and upper pin 63 causes connection member 55 to swing around center pin 65 via upper long hole 55b. Accordingly, release operation member 54 moves forward and returns to the initial position (from FIG. 6B to FIG. 6A). In tape feeder 16 having such a configuration, unless press operation unit 54*a* is subjected to a press operation, regulation member 52 of lock mechanism 50 is positioned at the lock position, and sprocket 41 is in a locked state.

Figure 9A:
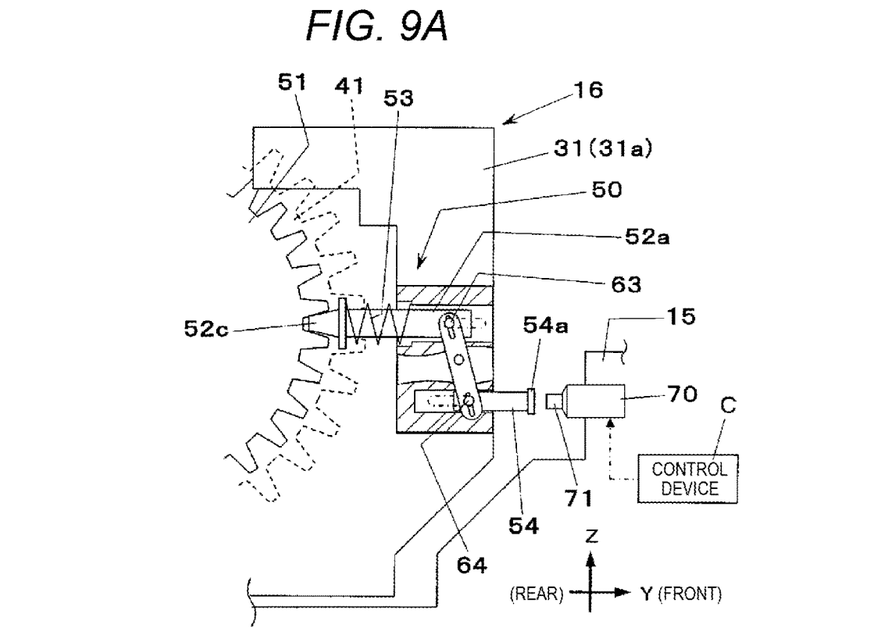
FIG. 9A is a view describing an operation of the lock mechanism included in the tape feeder of the exemplary embodiment of the present disclosure.

In a case where tape feeder 16 is installed in feeder base 15 and is used as a component supplier of component mounter 1, worker OP attaches tape feeder 16 to feeder base 15. Cylinder 70 is provided in feeder base 15 (FIGS. 2 and 4). When tape feeder 16 is attached to feeder base 15, press operation unit 54*a* of tape feeder 16 thereof and piston rod 71 of cylinder 70 confront each other in the forward-rearward direction (FIG. 9A).

Figure 9B:
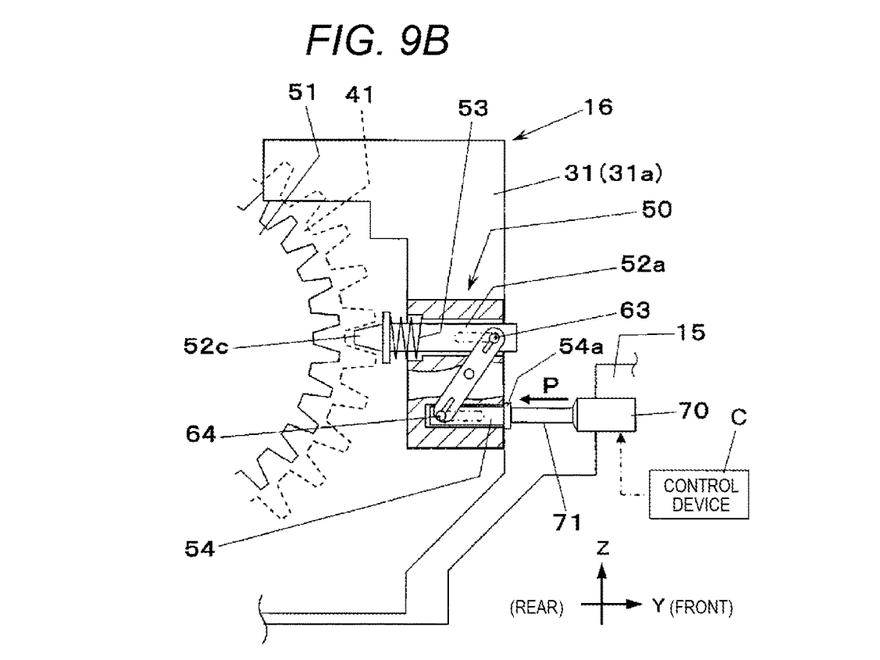
FIG. 9B is a view describing an operation of the lock mechanism included in the tape feeder of the exemplary embodiment of the present disclosure.

Operations of each cylinder 70 are controlled by control device C included in component mounter 1. In a case where power is supplied to tape feeder 16 attached to feeder base 15 such that tape feeder 16 is in a usable state, control device C causes (moves rearward) piston rod 71 of cylinder 70 to advance (arrow P indicated in FIG. 9B). Accordingly, press operation unit 54*a* of tape feeder 16 is pressed rearward by piston rod 71 of cylinder 70, and since regulation member 52 is positioned from the lock position to the unlock position, the locked state of sprocket 41 is released (from FIG. 9A to FIG. 9B).

Meanwhile, in a case where power is stopped being supplied to tape feeder 16 attached to feeder base 15 such that tape feeder 16 is in a non-usable state, control device C causes (moves forward) piston rod 71 of cylinder 70 to retreat. Accordingly, regulation member 52 of lock mechanism 50 is positioned at the lock position, and sprocket 41 is locked (from FIG. 9B to FIG. 9A).

As described above, tape feeder 16 of the present exemplary embodiment includes lock mechanism 50 which has press operation unit 54*a* operated with pressing force, locks sprocket 41 in main body 31 in a state where press operation unit 54*a* is not operated, and unlocks sprocket 41 in a state where press operation unit 54*a* is operated. Therefore, by causing press operation unit 54*a* to be pressed only when tape feeder 16 is used, sprocket 41 does not freely rotate when tape feeder 16 is not in use, and it is possible to avoid inconvenience caused due to free rotation of sprocket 41, for example, an occurrence of work adjusting a rotative position of sprocket 41 when power starts to be supplied to tape feeder 16 again.

In addition, as in the above-described example, operations of locking and unlocking sprocket 41 is automated by providing an unlock mechanism (for example, cylinder 70 described above) pressing press operation unit 54*a*, on the component mounter side, thereby being preferable. Particularly, since cylinder 70 described above is configured to operate press operation unit 54*a* in a state where power is supplied to tape feeder 16 and to release operation of operating press operation unit 54*a* in a state where power is not supplied to tape feeder 16, even if tape feeder 16 is in a state of being attached to feeder base 15, when tape feeder 16 is in a non-use state, rotation of sprocket 41 can be regulated. Therefore, even in a case where carriage 14 is moved while tape feeder 16 remains in a state of being attached to feeder base 15, it is possible to obtain an effect described above.

Figure 10A:
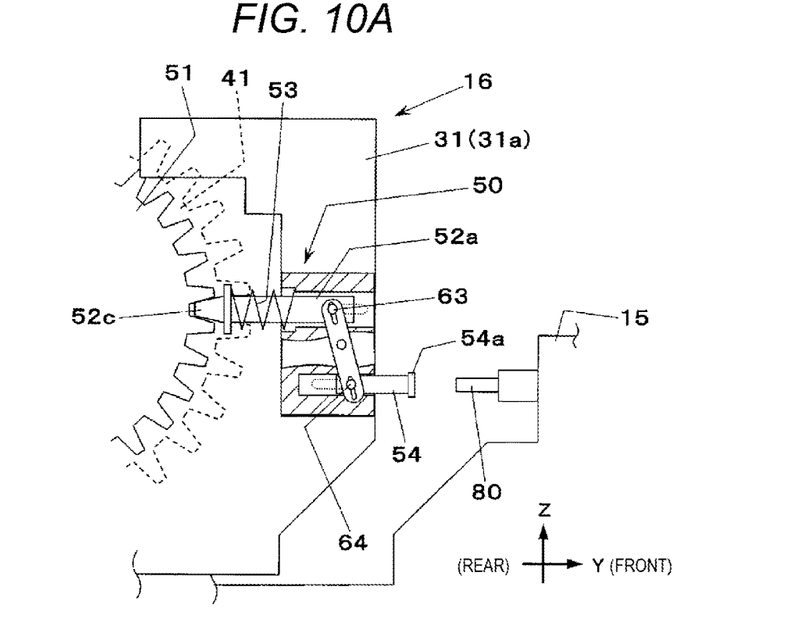
FIG. 10A is a view describing an operation of the lock mechanism included in the tape feeder of the exemplary embodiment of the present disclosure.
Figure 10B:
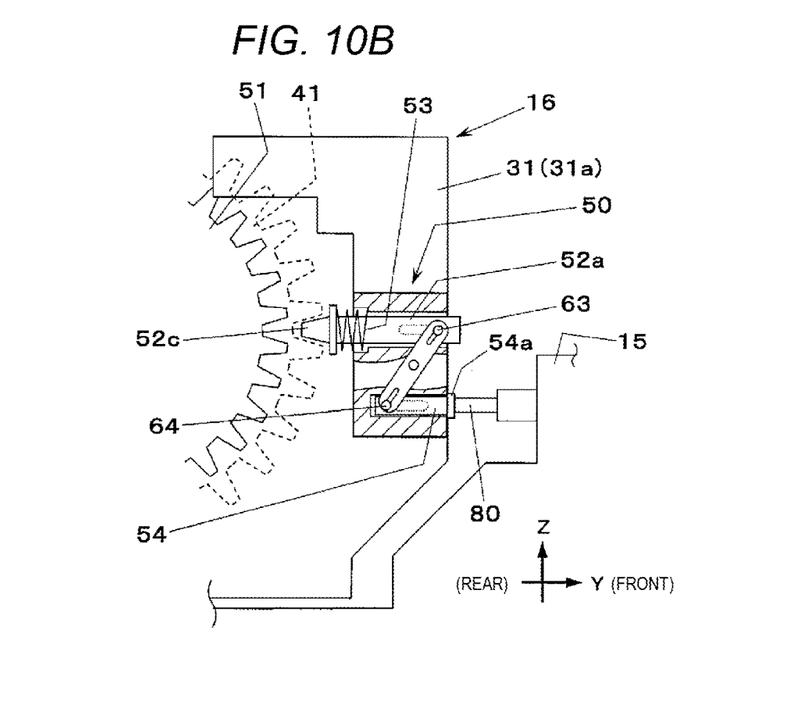
FIG. 10B is a view describing an operation of the lock mechanism included in the tape feeder of the exemplary embodiment of the present disclosure.

The unlock mechanism is not limited to cylinder 70 described above and can have a different configuration. For example, as illustrated in FIGS. 10A and 10B, feeder base 15 may be configured to be provided with projection member 80 as the unlock mechanism such that when tape feeder 16 is attached to feeder base 15, press operation unit 54*a* is pressed by projection member 80 in response to the attaching operation, and regulation member 52 is positioned from the lock position to the unlock position (from FIG. 10A to FIG. 10B). In this case, sprocket 41 can rotate in a state where tape feeder 16 is attached to feeder base 15, and rotation of sprocket 41 is regulated when tape feeder 16 is detached from feeder base 15.

Figure 11A:
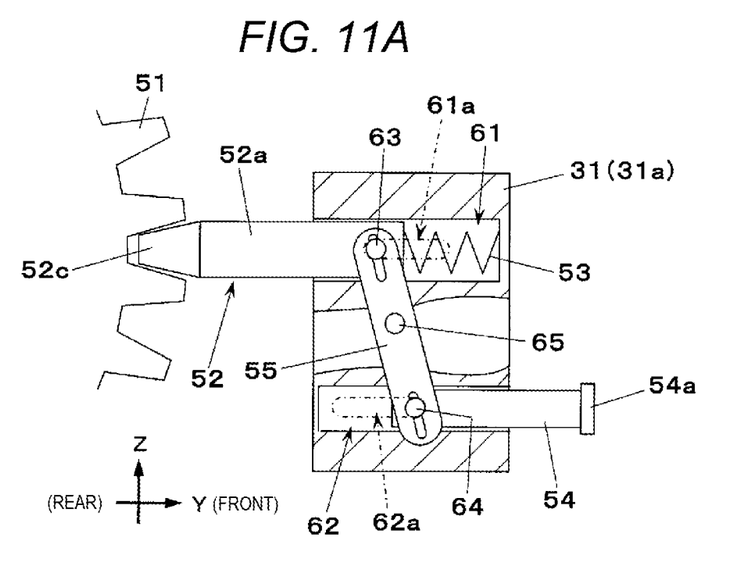
FIG. 11A is a view describing an operation of a lock mechanism included in a tape feeder of a first modification example of the exemplary embodiment of the present disclosure.
Figure 11B:
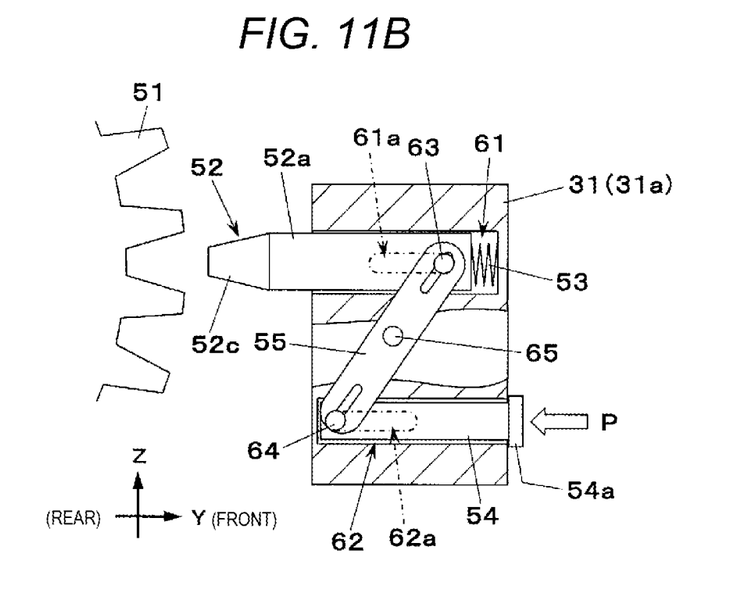
FIG. 11B is a view describing an operation of the lock mechanism included in the tape feeder of the first modification example of the exemplary embodiment of the present disclosure.

In addition, for example, lock mechanism 50 can be modified as described below. In a first modification example illustrated in FIGS. 11A and 11B, biasing spring 53 is configured to be disposed on the front side of regulation member 52 so as to be housed inside upper cylinder 61. Here, biasing spring 53 biases the end of regulation member 52 on the front side (end of carrier tape 18 on a side in the traveling direction) in the contact direction (rearward) toward rotation member 51. In the first modification example as well, in a state where no pressing force acts on press operation unit 54*a*, projection 52*c* of regulation member 52 is positioned at "lock position" while being in contact with rotation member 51 (FIG. 11A). However, when press operation unit 54*a* is pressed rearward in a state where sprocket 41 is locked (arrow P indicated in FIG. 11B), regulation member 52 is positioned at "unlock position" where projection 52*c* is separated from rotation member 51 (FIG. 11B). In the first modification example, flange 52*b* of regulation member 52 is not necessary, and thus, there is no need to form spring container 61B.

Figure 12A:
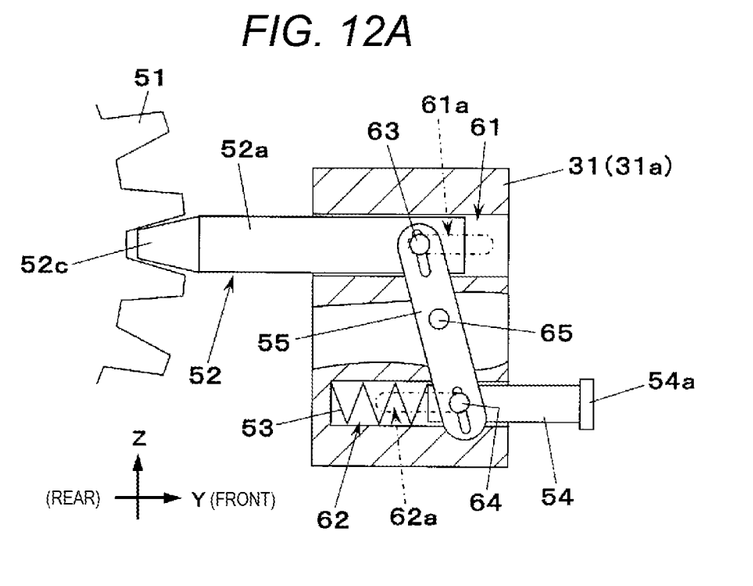
FIG. 12A is a view describing an operation of a lock mechanism included in a tape feeder of a second modification example of the exemplary embodiment of the present disclosure.
Figure 12B:
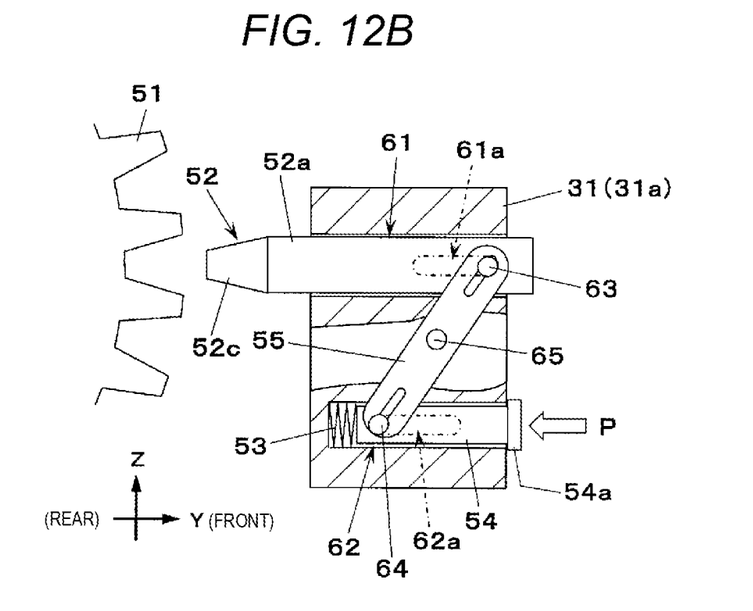
FIG. 12B is a view describing an operation of the lock mechanism included in the tape feeder of the second modification example of the exemplary embodiment of the present disclosure.

In a second modification example illustrated in FIGS. 12A and 12B, biasing spring 53 is housed inside lower cylinder 62, and biasing spring 53 directly biases release operation member 54 forward. In the second modification example as well, in a state where no pressing force acts on press operation unit 54*a*, projection 52*c* of regulation member 52 is positioned at "lock position" while being in contact with rotation member 51 (FIG. 12A). However, when press operation unit 54*a* is pressed rearward in a state where sprocket 41 is locked (arrow P indicated in FIG. 12B), regulation member 52 is positioned at "unlock position" where projection 52*c* is separated from rotation member 51 (FIG. 12B).

The first modification example and the second modification example illustrate examples wherein upper cylinder 61 and lower cylinder 62 formed so as to extend in the forward-rearward direction (traveling direction of carrier tape 18) are included in lock mechanism attacher 31*a* positioned in front of rotation member 51 (on the side in the traveling direction of carrier tape 18) in main body 31, and wherein in a case where regulation member 52 is provided in one of upper cylinder 61 and lower cylinder 62, and a portion of the lock releaser (in the above-described examples, release operation member 54) is provided in the other one of upper cylinder 61 and lower cylinder 62, biasing spring 53 is provided inside at least one of upper cylinder 61 and lower cylinder 62. Even in a case of lock mechanism 50 having the configuration of the first modification example and the second modification example, it is possible to obtain an effect similar to that of lock mechanism 50 described above.

Lock mechanism 50 may have a different configuration as long as lock mechanism 50 has a configuration in which sprocket 41 is locked in main body 31 in a state where press operation unit 54*a* is not operated, and sprocket 41 is unlocked in a state where press operation unit 54*a* is operated. Thus, for example, the configuration may include a disk-shaped disk member in which a rotation member rotates together with sprocket 41, that is, a mechanism regulating rotation of sprocket 41 by causing a pair of regulation members to come into contact so as to pinch the rotation member from both side surfaces (so-called disk brake).

The lock releaser of lock mechanism 50 is acceptable as long as regulation member 52 is configured to be separated from rotation member 51 against the biasing force of biasing spring 53 when press operation unit 54a is operated. The lock releaser is not limited to the configuration including release operation member 54 and connection member 55 described above. A relationship between the moving direction of regulation member 52 and the moving direction of release operation member 54 is also free. In the configuration described above, the moving direction of release operation member 54 and the moving direction of regulation member 52 are directions opposite to each other. However, the moving direction of release operation member 54 and the moving direction of regulation member 52 may be the same directions.

As described above, tape feeder 16 of the present exemplary embodiment includes lock mechanism 50 in which sprocket 41 is locked in main body 31 in a state where press operation unit 54a is not operated, and sprocket 41 is unlocked in a state where press operation unit 54a is operated. Therefore, it is possible to avoid inconvenience in which sprocket 41 freely rotates when tape feeder 16 is not in use, by causing press operation unit 54a to be pressed only when tape feeder 16 is used.

It is possible to provide a tape feeder that can prevent inconvenience in which a sprocket freely rotates when not in use.

What is claimed is:

1. A tape feeder which performs pitch feeding of a carrier tape holding a component so as to supply the component to a pick-up position, the tape feeder comprising:
   a main body that has a tape traveling path which is a traveling path of the carrier tape;
   a sprocket that is provided in the main body, causes an outer peripheral tooth to engage with a feed hole of the carrier tape, and rotates so as to perform pitch feeding of the carrier tape on the tape traveling path; and
   a lock mechanism that has a press operation unit operated with pressing force; and
   wherein the lock mechanism includes a rotation member which rotates integrally with the sprocket, a regulation member which comes into contact with the rotation member and regulates rotation of the sprocket, a biasing member which biases the regulation member in a contact direction toward the rotation member, and a lock releaser which separates the regulation member from the rotation member against biasing force of the biasing member when the press operation unit is operated,
   wherein a lock mechanism attacher positioned on a side in a traveling direction of the carrier tape of the rotation member in the main body includes an upper cylinder and a lower cylinder formed so as to extend in the traveling direction of the carrier tape, and wherein the regulation member is provided at one end of one of the upper cylinder and the lower cylinder, a portion of the lock releaser is provided at one end of the other one of the upper cylinder and the lower cylinder, and the biasing member is provided at another end of the one of the upper cylinder and the lower cylinder in which the regulation member is provided.

2. The tape feeder of claim 1,
   wherein the press operation unit is operated by an unlock mechanism provided in the component mounter.

3. The tape feeder of claim 2,
   wherein the unlock mechanism is a cylinder provided in the component mounter.

4. The tape feeder of claim 3,
   wherein the press operation unit is operated by the cylinder in a state where power is supplied to the tape feeder, and is released from being operated by the cylinder in a state where power is not supplied to the tape feeder.

5. The tape feeder of claim 2,
   wherein the unlock mechanism is a projection member provided in the component mounter.

6. The tape feeder of claim 1,
   wherein the biasing member biases an intermediate part of the regulation member in the contact direction toward the rotation member.

7. The tape feeder of claim 1,
   wherein the press operation unit is operated by an unlock mechanism provided in the component mounter.

8. The tape feeder of claim 1,
   wherein the lock mechanism locks the sprocket in the main body in a state where the press operation unit is not operated, and unlocks the sprocket in a state where the press operation unit is operated.

9. A component mounter, comprising:
   the tape feeder of claim 1; and
   a suction nozzle for sucking the component supplied to the pick-up position by the tape feeder.

* * * * *